United States Patent
Kusakawa

(10) Patent No.: US 6,191,369 B1
(45) Date of Patent: Feb. 20, 2001

(54) PRINTED CIRCUIT BOARD HAVING A MARKER TRACE FOR COMPONENT ALIGNMENT

(75) Inventor: Shinichi Kusakawa, Saitama (JP)

(73) Assignee: Asahi Kogaku Kogyo Kabushiki Kaisha, Tokyo (JP)

(*) Notice: Under 35 U.S.C. 154(b), the term of this patent shall be extended for 0 days.

(21) Appl. No.: 09/181,619

(22) Filed: Oct. 28, 1998

(30) Foreign Application Priority Data

Oct. 31, 1997 (JP) .................................................... 9-300780

(51) Int. Cl.[7] ...................................................... H05K 1/16
(52) U.S. Cl. .............................................. 174/260; 174/261
(58) Field of Search .................................... 174/260, 261; 361/777, 778, 779; 257/797

(56) References Cited

U.S. PATENT DOCUMENTS

| | | | |
|---|---|---|---|
| 5,042,147 | * 8/1991 | Tashiro ................................... | 29/847 |
| 5,418,329 | * 5/1995 | Katoh et al. ........................... | 174/52.3 |
| 5,777,853 | * 7/1998 | Dorfmeyer ............................. | 361/777 |
| 5,898,574 | * 4/1999 | Tan et al. ............................... | 361/777 |
| 5,903,051 | * 5/1999 | Miks et al. ............................. | 257/700 |

* cited by examiner

Primary Examiner—Jeffrey Gaffin
Assistant Examiner—Jeremy Norris
(74) Attorney, Agent, or Firm—Greenblum & Bernstein, P.L.C.

(57) ABSTRACT

A printed circuit board 100 comprises a substrate 102 and a plurality of conductive traces 104–116 formed on the surface of the substrate 102. The conductive traces 104–116 include a marker trace 104 which is formed through the same process and of the same material as the other conductive traces 106–116 used for electrical signal transmission. The marker trace 104 may be so formed as to surround a desired footprint FP1 of a double-sided adhesive sheet 140 to be bonded on the printed circuit board 100. In this manner, a marker, such as the marker trace 104, may be formed without any need for additional and/or dedicated marker-forming process.

12 Claims, 4 Drawing Sheets

PRINTED CIRCUIT BOARD HAVING A MARKER TRACE FOR COMPONENT ALIGNMENT

The present disclosure relates to subject matter contained in Japanese Patent Application No. Hei-9-300780 filed on Oct. 31, 1997, which is expressly incorporated herein by reference in its entirety.

BACKGROUND OF THE INVENTION

1. Field of the Invention

The present invention relates to a printed circuit board having a marker formed thereon, with which a member to be mounted on the printed circuit board may be conveniently positioned with respect to the printed circuit board.

2. Description of the Related Art

There are various members which may be possibly mounted on a printed circuit board. For example, a double-sided adhesive tape may be often bonded on a flexible printed circuit board in order to secure the flexible printed circuit board to a certain place within a tight space in a housing of an electronic device. Also, an insulating adhesive tape may be bonded on such flexible printed circuit board in order to electrically insulate the conductive traces formed thereon from any other conductors (including conductive traces of other flexible circuit boards and other wiring conductors) housed in such electronic device. Further, various circuit elements and components, such as an integrated circuit chip (IC), may be mounted on a printed circuit board by soldering. Even relatively massive components and devices, such as a liquid crystal display (LCD), may be mounted on a printed circuit board by means of a suitable attachment, such as a support frame and/or a fixture member.

Some prior art printed circuit boards have no suitable marker formed thereon, with which a member to be mounted on the printed circuit board may be conveniently positioned with respect to the printed circuit board. When, for example, a circuit element is to be mounted on a printed circuit board with no such marker, a special soldering jig may be often used to establish positioning of the circuit element with respect to the printed circuit board. Other prior art printed circuit boards have a marker usable for such purpose, which however has to be formed through a certain, additional and dedicated maker-forming process to be performed after the conductive traces of the printed circuit board have been formed. Accordingly, fabrication of any prior art printed circuit boards has suffered from time-consuming mounting process of members which need precise positioning with respect to the printed circuit boards.

SUMMARY OF THE INVENTION

In view of the foregoing, it is an object of the present invention to provide a printed circuit board having a marker formed thereon, with which a member to be mounted on the printed circuit board may be conveniently positioned with respect to the printed circuit board, and in which the marker may be formed without any need for additional and/or dedicated marker-forming process.

In accordance with the present invention, there is provided a printed circuit board comprising a substrate, a plurality of conductive traces formed on the surface of the substrate for electrical signal transmission, a marker trace formed on the surface of the substrate for indicating at least a part of a desired footprint of a member to be mounted on the surface of the printed circuit board, and the marker trace being formed of the same material as the conductive traces.

With this arrangement, since the marker trace is formed of the same material as the conductive traces, the marker trace may be formed through the same process as the conductive traces and thus simultaneously with the conductive traces. An assemblage worker can achieve precise positioning, with respect to a printed circuit board, of a member to be mounted on the printed circuit board, just by aligning the outer edges of the member to the outer boundary of the desired footprint on the printed circuit board which is indicated by the marker trace.

The marker trace may indicate the entire outer boundary of the desired footprint of the member.

Where the desired footprint of the member is of an elongate shape having opposite ends, the marker trace may indicate such portions of the outer boundary of the desired footprint of the member that correspond to the opposite ends of the elongate shape.

Where the desired footprint of the member is of a generally rectangular shape having four side edges, the marker trace may indicate such portions of the outer boundary of the desired footprint of the member that correspond to three of the four side edges of the generally rectangular shape. Alternatively, in such a case, the marker trace may indicate such portions of the outer boundary of the desired footprint of the member that correspond to the four side edges of the generally rectangular shape.

The member to be mounted on the surface of the printed circuit board may comprise a double-sided adhesive sheet or may comprise a liquid crystal display panel.

Alternatively or additionally, the member may comprise an interconnection-wiring rubber block for electrically interconnecting a liquid crystal display panel and at least some of the conductive traces formed on the surface of the substrate.

Further, the member may comprise a circuit element. Also, the member may comprise a terminal of a circuit element and the marker trace may also indicate a soldering area for the terminal.

Moreover, the marker trace may comprise a conductive trace for electrical signal transmission.

BRIEF DESCRIPTION OF THE DRAWINGS

The above and other objects, features and advantages of the present invention will be apparent from the following detailed description of several preferred embodiments thereof, reference being made to the accompanying drawings, in which.

DETAILED DESCRIPTION OF PREFERRED EMBODIMENTS

Referring now to the accompanying drawings, several preferred embodiments of the present invention will be described in detail.

Figure 1:
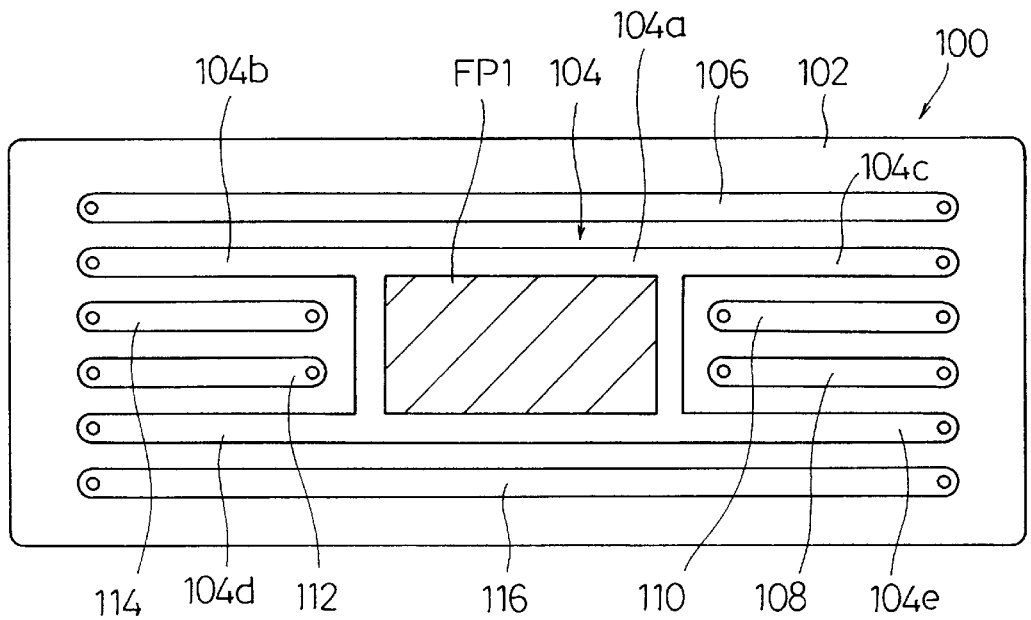
FIG. 1 is a plan view of a printed circuit board according to a first embodiment of the present invention.
Figure 2:
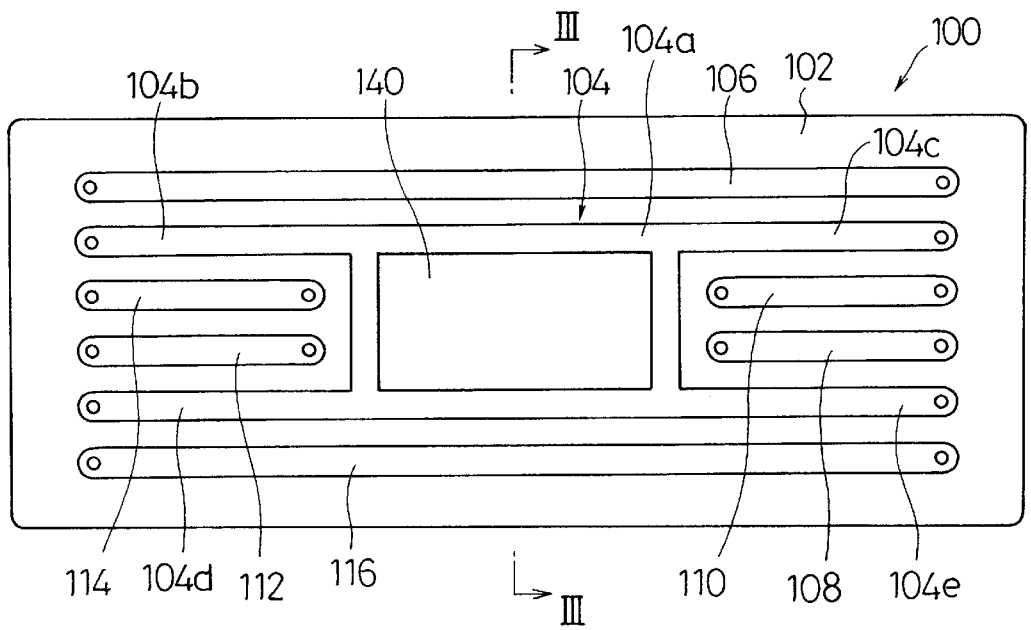
FIG. 2 is a plan view, similar to FIG. 1, with a double-sided adhesive sheet bonded on the printed circuit board.
Figure 3:
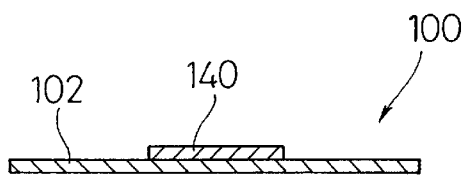
FIG. 3 is a cross-sectional view taken along line III—III in FIG. 2.

FIGS. 1 to 3 show a printed circuit board 100 according to a first embodiment of the present invention. FIG. 1 is a plan view of the printed circuit board 100 itself, FIG. 2 shows the printed circuit board 100 with a double-sided adhesive sheet bonded thereon, and FIG. 3 is a cross-sectional view taken along line III—III in FIG. 2. Various circuit elements and components, which are to be mounted on the circuit board 100, are not shown for simplicity.

Referring first to FIG. 1, the printed circuit board 100 in accordance with the first embodiment of the present invention is a so-called rigid printed circuit board, and comprises a rigid insulating substrate 102 made of a suitable plastic material. The substrate 102 has a pair of opposed planar surfaces, i.e., top and bottom surfaces. As shown, the printed circuit board 100 further comprises a plurality of conductive traces 104, 106, 108, 110, 112, 114 and 116 formed on the top surface of the substrate 102. Various circuit elements and components, one or more other circuit boards and/or one or more wiring cables may be connected to the conductive traces 104 to 116 for electrical signal transmission purposes. The conductive traces 104 to 116 may be formed with any of various known techniques for fabricating printed circuit board, such as photo-etching performed to a copper-clad plastic board. In any event, all the conductive traces 104 to 116 on the substrate 102 are formed simultaneously.

The printed circuit board 100 is designed to have a double-sided adhesive sheet 140 bonded on the top surface thereof, and the adhesive sheet 140 has to be applied on the board 100 at a selected position with precision. The adhesive sheet 140 is of a generally rectangular shape as viewed in plan. Thus, the adhesive sheet 140 has a desired footprint which is of the corresponding, generally rectangular shape. As shown, the desired footprint of the adhesive sheet 140 is to be defined on the top surface of the printed circuit board 100 at the central area thereof, as indicated by a hatched area FP1.

In accordance with one aspect of the present invention, one of the conductive traces, 104, is formed as a marker trace for indicating the entire outer boundary of the desired footprint FP1 of the double-sided adhesive sheet 140 to be bonded on the surface of the printed circuit board 100. More specifically, the marker trace 104 comprises a rectangular ring portion 104a surrounding the footprint FP1 and four stubs 104b, 104c, 104d and 104b extending in the horizontal directions (as viewed in FIGS. 1 and 2) from the rectangular ring portion 104a. The desired footprint FP1 is of a generally rectangular shape having four side edges; and the marker trace 104 indicates the outer boundary of the desired footprint FP1 comprising these four side edges as described below. Note that the marker trace 104 can serve not only as a marker but also as a conductor for electrical signal transmission.

The rectangular double-sided adhesive sheet 140 is prepared to secure a certain electronic component onto the top surface of the printed circuit board 100 and has a size suitable for this purpose. The footprint FP1, which is defined by the inner edges of the rectangular ring portion 104a of the marker trace 104, is designed to have the same size as the adhesive sheet 140. When the adhesive sheet 140 is positioned with respect to the printed circuit board 100, the outer edges of the adhesive sheet 140 are aligned to the outer boundary of the footprint FP1 (and thus to the inner edges of the rectangular ring portion 104a of the marker trace 104). In this manner, the registration of the adhesive sheet 140 with respect to the footprint FP1 can be conveniently achieved with precision.

As understood from the above, with the printed circuit board 100 according to the first embodiment of the present invention, the marker (i.e., the marker trace 104) for indicating the desired footprint FP1 of the double-sided adhesive sheet 140 may be formed through the same process as the other conductive traces 106 to 116 on the printed circuit board 100.

Further, with the printed circuit board 100 according to the first embodiment, the marker trace 104 may or may not be used for electrical signal transmission. It is just important that the maker trace 104 is formed through the same process and of the same material as the other conductive traces 106 to 116 that are used for electrical connection with other circuit elements and components (not shown) and thus the marker trace 104 is formed simultaneously with these conductive traces 106 to 116. It is also important that the maker trace 104 includes a portion thereof which surrounds the outer boundary of the desired footprint FP1 of the double-sided adhesive sheet 140 and defines the four side edges of the rectangular footprint FP1. Also note that the above described arrangement may be applied to a flexible printed circuit board as well.

Figure 4A:
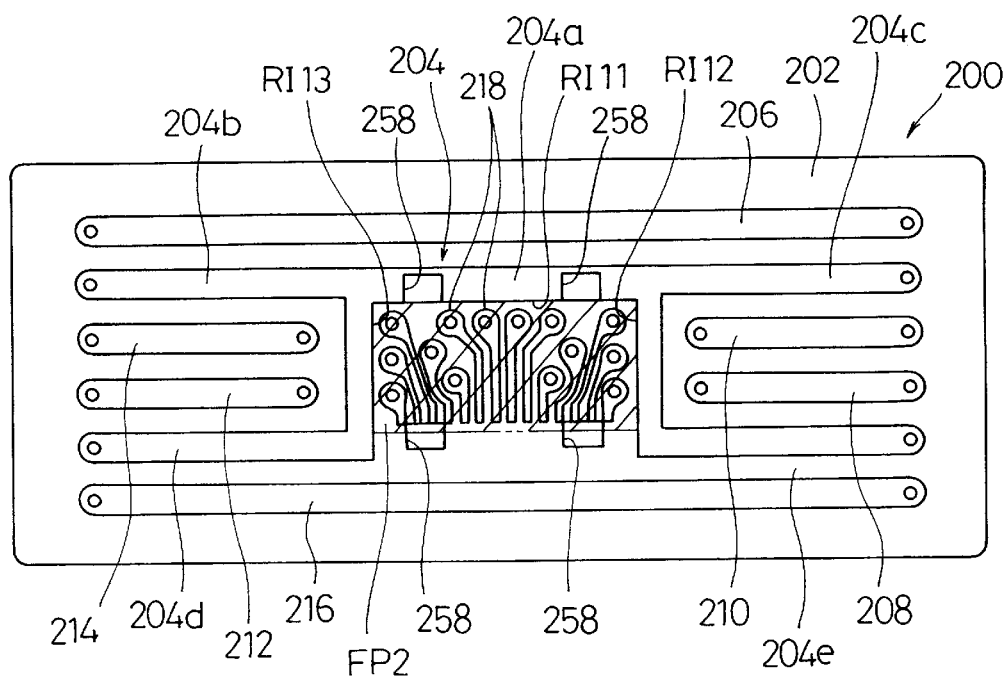
FIG. 4A is a plan view of a printed circuit board according to a second embodiment of the present invention.
Figure 4B:
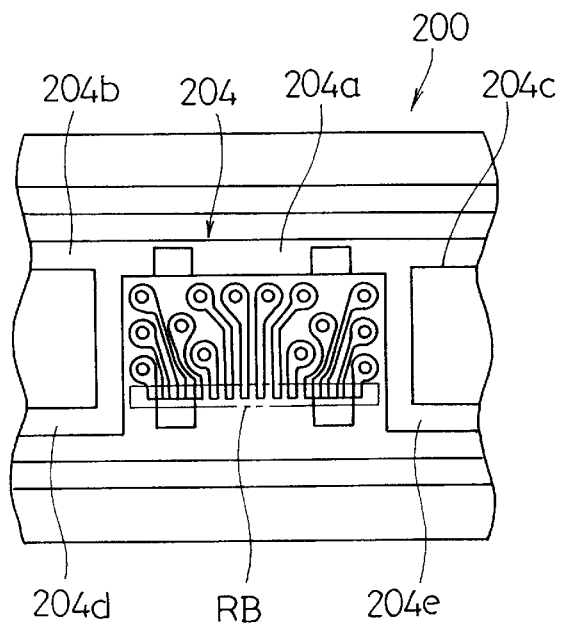
FIG. 4B is a partial plan view, similar to FIG. 4A, showing a desired footprint of an interconnection-wiring rubber block.
Figure 5:
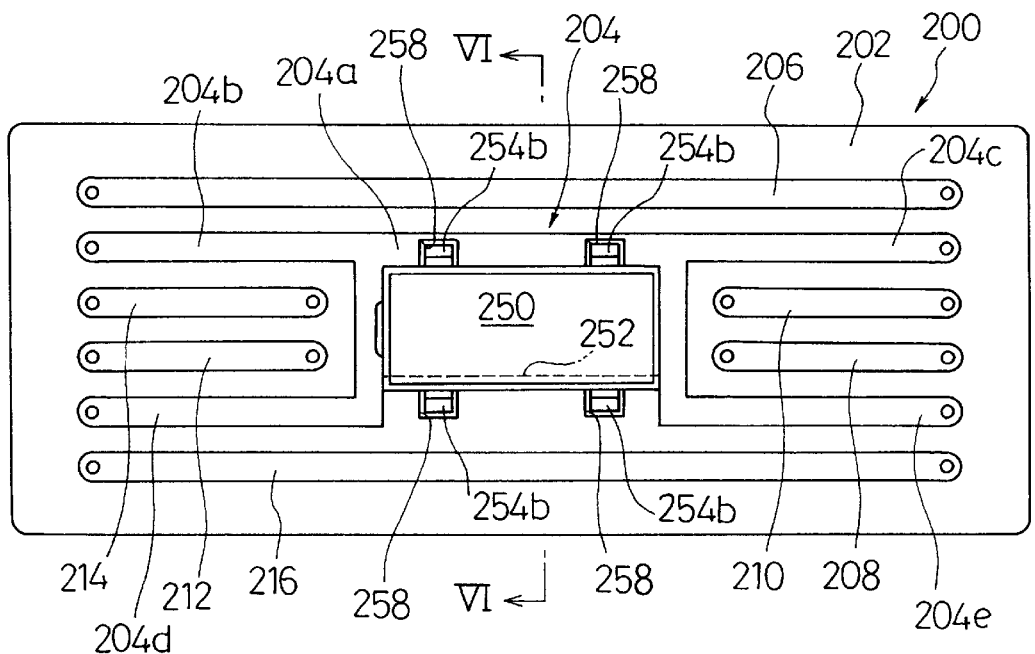
FIG. 5 is a plan view, similar to FIG. 4A, with a liquid crystal display panel mounted on the printed circuit board.
Figure 6:
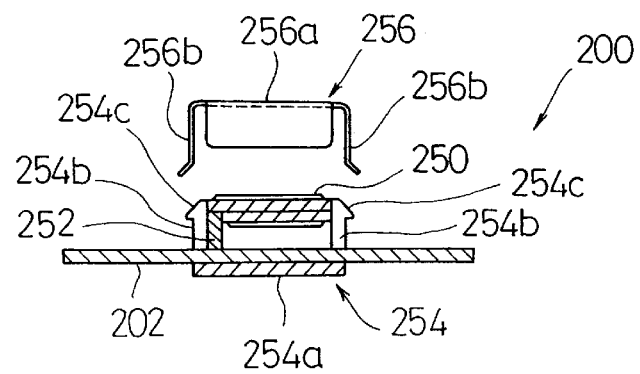
FIG. 6 is a cross-sectional view taken along line VI—VI in FIG. 5.

FIGS. 4 to 6 show a printed circuit board 200 according to a second embodiment of the present invention. FIG. 4A is a plan view of the printed circuit board 200 itself, FIG. 4B is a partial plan view thereof, FIG. 5 shows the printed circuit board 200 with a liquid crystal display panel disposed thereon, and FIG. 6 is a cross-sectional view taken along line VI—VI in FIG. 5. Various circuit elements and components, which are to be mounted on the circuit board 200, are not shown for simplicity.

With reference to FIGS. 4A and 4B, the printed circuit board 200 in accordance with the second embodiment of the present invention is a so-called rigid printed circuit board, and comprises a rigid insulating substrate 202 made of a suitable plastic material. The substrate 202 has a pair of opposed planar surfaces, i.e., top and bottom surfaces. As shown, the printed circuit board 200 further comprises a plurality of conductive traces 204, 206, 208, 210, 212, 214 and 216 formed on the top surface of the substrate 202. Various circuit elements and components, one or more other circuit boards and/or one or more wiring cables may be connected to the conductive traces 204 to 216 for electrical signal transmission purposes.

The printed circuit board 200 is designed to support a liquid crystal display (LCD) panel 250 which has to be mounted on the board 200 at a selected position with precision. The LCD panel 250 is of a generally rectangular shape as viewed in plan. Thus, the LCD panel 250 has a desired footprint which is of the corresponding, generally rectangular shape. As shown, the desired footprint of the LCD panel 250 is to be defined on the printed circuit board 200 at the central area thereof, as indicated by a hatched area FP2.

The LCD panel 250 has a plurality of terminals for powering and drive/output signal transmission purposes, which are arrayed in line along one side edge of the LCD panel 250 (i.e., the lower side edge thereof as viewed in FIG.

5). In order to provide electrical connection between the LCD panel 250 and the related circuitry (not shown) on the printed circuit board 200, the board 200 comprises a pattern of relatively fine conductive traces 218 (including fourteen conductive traces as shown) formed on the top surface of the substrate 202 within the desired footprint FP2 of the LCD panel 250. The fine conductive traces 218 are, on the one hand, connected with the related circuitry on the board 200. On the other hand, the fine conductive traces 218 and the respective terminals of the LCD panel 250 are electrically connected with each other through an interconnection-wiring rubber block 252 (FIG. 6).

The rubber block 252 is an elongate, rectangular parallelepiped block comprising a plurality of conductive and nonconductive (or insulating) rubber layers joined together and arranged to lie alternatively along the longitudinal axis of the parallelepiped. All the conductive rubber layers have the same thickness, so do the all the nonconductive rubber layers. The conductive rubber layers are therefore disposed equidistant in the rubber block 252. When used, the elongate rubber block 252 is disposed on the top surface of the printed circuit board 200 with its longitudinal axis extending parallel to the top surface of the board 200 as well as with its one side in contact with the top surface of the board 200. Thus, the rubber block 252 has a desired footprint of an elongate rectangular shape, which is to be defined on the top surface of the board 200 as shown by imaginary lines and designated by RB in FIG. 4B.

In this embodiment, both of the desired footprint FP2 of the LCD panel 250 and the desired footprint RB of the rubber block 252 are rectangular in shape, and the lower side edges (as viewed in FIGS. 4A and 4B) of the desired footprints FP2 and RB are coincident.

The fine conductive traces 218 formed within the desired footprint FP2 of the LCD panel 250 have respective first ends (lower ends as viewed in FIG. 4A) arrayed equidistant in line and lying in the desired footprint RB of the interconnection-wiring rubber block 250. The distance between adjacent two first ends of the fine conductive traces 218 is selected to be equal to that between two adjacent conductive rubber layers of the rubber block 250, so that the first ends of the fine conductive traces 218 may be in contact with and in electrical connection to the respective conductive rubber layers of the rubber block 250.

The fine conductive traces 218 have respective second ends (upper ends as viewed in FIGS. 4A and 4B) terminating at respective through-holes (indicated by small circles in FIGS. 4A and 4B). As shown, the through-holes are formed in the printed circuit board 200 while being spread over the desired footprint FP2 of the LCD panel 250. The conductive traces 204 to 216, as well as the fine conductive traces 218, may be formed with any of various known techniques for fabricating a printed circuit board, such as photo-etching performed to a copper-clad plastic board. In any event, all the conductive traces 204 to 216 and 218 on the substrate 202 are formed simultaneously.

In accordance with one aspect of the present invention, one of the conductive traces, 204, is formed as a marker trace for indicating three of the four side edges of the outer boundary of the rectangular, desired footprint FP2 of the LCD panel 250 as defined on the printed circuit board 200. More specifically, the marker trace 204 comprises a rectangular gate-shaped portion 204a and four stubs 204b, 204c 204d and 204e extending in the horizontal directions (as viewed in FIGS. 4A, 4B and 5) from that portion 204a. The rectangular gate-shaped portion 204a comprises one horizontal and two vertical linear trace portions. Respective inner edges RI11, RI12 and RI13 (FIG. 4A) of the linear trace portions will serve as the reference for positioning purposes (and thus are referred to as the "reference inner edges" hereinafter) and define three of the four side edges of the desired footprint FP2 of the LCD panel 250. (i.e., the upper, right and left side edges as viewed in FIG. 4A). Note that the marker trace 204 can serve not only as a marker but also as a conductor for electrical signal transmission.

The LCD panel 250 is attached to the printed circuit board 200 by means of a support member 254 and a fixture member 256. The support member 254 and the fixture member 256 are designed to couple with each other so as to clamp between them the LCD panel 250, the interconnection-wiring rubber block 252 and the printed circuit board 200. More specifically, the support member 254 is a one-piece plastic member having a base plate portion 254a and four arms 254b extending upright in one direction from the base plate portion 254a and having respective engagement claws 254c at the respective tip ends thereof, as shown in FIG. 6.

The printed circuit board 200 has four square openings 258 extending therethrough at positions along the upper and lower side edges (as viewed in FIGS. 4A, 4B and 5) of the desired footprint FP2 of the LCD panel 250. The four square openings 258 are formed such that they receive the four arms 254b of the support member 254 with sufficient allowance left between the openings 258 and the respective arms 254b to permit minute displacement of the support member 254 relative to the printed circuit board 200 in all directions parallel to the surfaces of the board 200. This enables adjustment in these directions of the relative position of the support member 254 with respect to the printed circuit board 200.

The fixture member 256 is a one-piece member made of a thin stainless-steel sheet punched out and bent by press working into a desired shape as shown in FIG. 6. The fixture member 256 has a frame portion defining a window through which the front surface of the LCD panel 250 may be observed and four skirt portions 256b extending downward (as viewed in FIG. 6) from the respective side edges of the frame portion 256a. The frame portion 256a is engageable with the peripheral edges of the LCD panel 250 such that the front portion of the LCD panel 250 may be fitted snug in the window of the frame portion. The four skirt portions 256a include two longer skirt portions and two shorter skirt portions extending from the longer and shorter side edges, respectively, of the frame portion. Each of the longer skirt portions has a pair of engagement holes (not shown) for receiving the engagement claws 254c at the tip ends of the arms 254b of the support member 254.

In mounting the LCD panel 250 on the printed circuit board 200, first the arms 254b of the support member 254 are inserted through the respective square openings 258 formed in the printed circuit board 200 from the bottom side of the board 200, so that the plate portion 254a of the support member 254 is caused to be in contact with the bottom surface of the printed circuit board 200. Then, the interconnection-wiring rubber block 252 is so placed on the top surface of the board 200 as to be overlaid on its desired footprint RB with high registration. This registration can be achieved with ease by i) aligning the opposite end surfaces of the elongate rubber block 252 to the above-mentioned reference inner edges RI2 and RI3 of the maker trace 204 and ii) causing the lower side surface (as viewed in FIGS. 4A and 4B) of the elongate rubber block 252 to be in contact with the upper side surfaces of the lower two (again, as viewed in FIGS. 4A and 4B) of the four arms 254b of the support member 254. When the rubber block 252 is so placed, the conductive rubber layers of the rubber block 252 are positioned on and electrically coupled to the first ends of the corresponding fine conductive traces 218, and the tip ends of the arms 254b of the support member are higher than the top surface of the rubber block 252 as shown in FIG. 6.

Then, the LCD panel 250 is inserted between the tip ends of the four arms 254b of the support member 254, while that side edge thereof having the linear array of terminals is placed on the top surface of the rubber block 252, as shown in FIG. 6. At this point of time, the LCD panel 250 is positioned to be overlaid on its desired footprint FP2 on the printed circuit board 200 with high registration. This registration can be achieved with ease by aligning, in the vertical direction, the upper, right and left side edges (as viewed in FIG. 5) of the LCD panel 250 to the above-mentioned reference inner edges RI11, RI12 and RI13 of the maker trace 204, respectively. When the LCD panel 250 is so positioned, the terminals of the LCD panel 250 arrayed in line along the one side edge thereof are positioned on and electrically coupled to the corresponding conductive rubber layers of the rubber block 252, so that the electrical interconnections between the terminals of the LCD panel 250 and the corresponding fine conductive traces 218 are properly established. Further, at this point of time, the front surface (or the upper surface as viewed in FIG. 6) of the LCD panel 250 is higher than the tip ends of the arms 254b of the support member 254.

Finally, as shown in FIG. 6, the LCD panel 250 and the arms 254b of the support member 254 are covered with the fixture member 256, when the front portion of the LCD panel 250 is fit into the above-mentioned window of the fixture member 256. The fixture member 256, which is made of a thin stainless-steel plate as described above, is snapped on the arms 254b of the support member 254, and the engagement claws 254c of the arms 254b come into engagement with the corresponding engagement holes formed in the longer skirt portions of the fixture member 256. This engagement then keeps the support member 254 and the fixture member 256 in the assembled condition. When the fixture member 256 is being assembled with the support member 254 in this manner, the LCD panel 250 is urged by the fixture member 246 toward the printed circuit board 250 and the rubber block 252 is thereby compressed in the vertical direction to produce a resilient force. This resilient force in turn serves to urge the LCD panel 250 upward against the fixture member 256, which prevents any displacement of the related parts, including the LCD panel 250, the rubber block 252, the support member 254 and the fixture member 256, relative to the printed circuit board 200.

As understood from the above, with the printed circuit board 200 according to the second embodiment of the present invention, the marker (i.e., the marker trace 204) for indicating a part of the outer boundary of the desired footprint FP2 of the LCD panel 250 as well as indicating a part of the outer boundary of the desired footprint RB of the interconnection-wiring rubber block 252 may be formed through the same process as the other conductive traces 206 to 216 on the printed circuit board 200.

Further, with the printed circuit board 200 according to the second embodiment, the marker trace 204 may or may not be used for electrical signal transmission. It is just important that the marker trace 204 is formed through the same process and of the same material as the other conductive traces 206 to 216 used for electrical connection with other circuit elements and components (not shown) and thus is formed simultaneously with these conductive traces 206 to 216. It is also important that the maker trace 204 indicates such portions of the outer boundary of the desired footprint FP2 of the LCD panel 250 that correspond to three of the four side edges of this generally rectangular footprint FP2, as well as indicates such portions of the outer boundary of the desired footprint RB of the interconnection-wiring rubber block 252 that correspond to the opposite ends of this elongate footprint RB.

Figure 7:
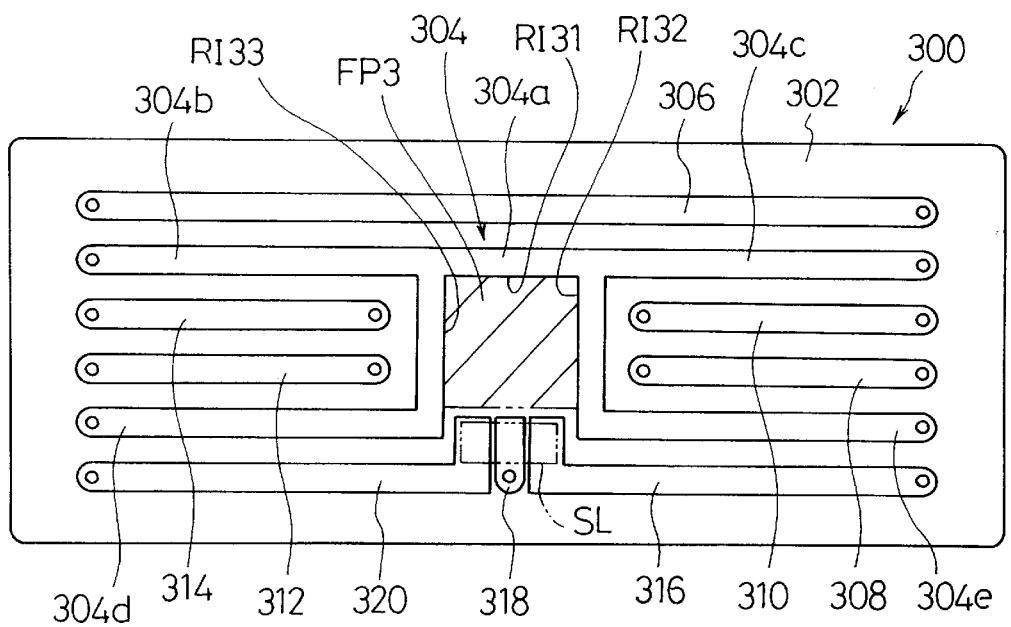
FIG. 7 is a plan view of a printed circuit board according to a third embodiment of the present invention.
Figure 8:
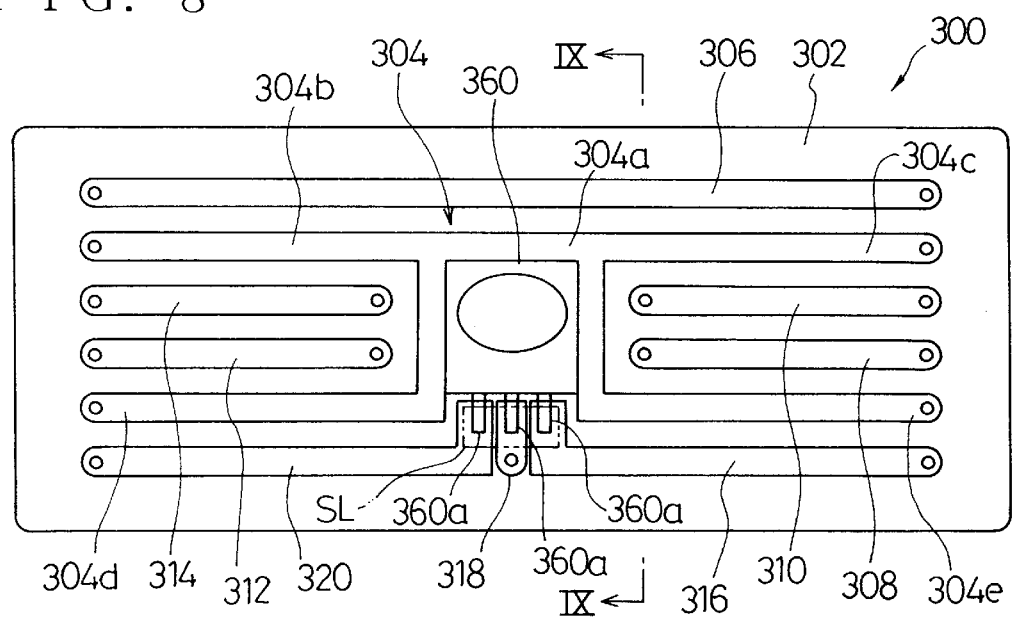
FIG. 8 is a plan view, similar to FIG. 7, with a circuit element mounted on the printed circuit board.
Figure 9:
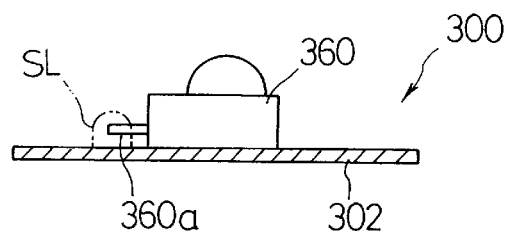
FIG. 9 is a cross-sectional view taken along line IX—IX in FIG. 8.

FIGS. 7 to 9 show a printed circuit board 300 according to a third embodiment of the present invention. FIG. 7 is a plan view of the printed circuit board 300 itself, FIG. 8 shows the printed circuit board 300 with a circuit element disposed thereon, and FIG. 9 is a cross-sectional view taken along line IX—IX in FIG. 8. Various other circuit elements and components, which are to be mounted on the circuit board 300, are not shown for simplicity.

With reference to FIG. 7, the printed circuit board 300 in accordance with the third embodiment of the present invention is a so-called rigid printed circuit board, and comprises a rigid insulating substrate 302 made of a suitable plastic material. The substrate 302 has a pair of opposed planar surfaces, i.e., top and bottom surfaces. As shown, the printed circuit board 300 further comprises a plurality of conductive traces 304, 306, 308, 310, 312, 314, 316, 318 and 320 formed on the top surface of the substrate 302. Various circuit elements and components, one or more other circuit boards and/or one or more wiring cables may be connected to the conductive traces 304 to 320 for electrical signal transmission purposes. The conductive traces 304 to 320 may be formed with any of various known techniques for fabricating a printed circuit board, such as photo-etching performed to a copper-clad plastic board. In any event, all the conductive traces 304 to 320 on the substrate 302 are formed simultaneously.

The printed circuit board 300 is designed to support a circuit element 360 which has to be mounted on the board 300 at a selected position with precision. The circuit element 360 is of a generally rectangular shape as viewed in plan. Thus, the circuit element 360 has a desired footprint FP3 which is of the corresponding, generally rectangular shape. As shown, the desired footprint FP3 of the circuit element 360 is to be defined on the top surface of the printed circuit board 300 at the central area thereof, as indicated by a hatched area FP3.

The circuit element 360 is a so-called surface mounting element, and has a plurality of terminals 360a (three, in the example shown) extending in parallel from one side (i.e., the lower side as viewed in FIG. 8) of the body of the circuit element 360. The terminals 360a are to be soldered to the conductive traces 316, 318 and 320, respectively. More specifically, the conductive trace 316 has a first end terminating near the right side edge (as viewed in FIGS. 7 and 8) of the board 300 and a second end just under the first of the terminals 360a. The conductive trace 318 extends in the vertical direction and has a first end terminating near the midpoint of the lower side edge (again as viewed in FIGS. 7 and 8) of the board 300 and a second end just under the second of the terminals 360a. The conductive trace 320 has a first end terminating near the left edge (again as viewed in FIGS. 7 and 8) of the board 300 and a second end just under the third of the terminals 360a. The conductive traces 316 and 320 are bent at their second ends. The second ends of the conductive traces 316, 318 and 320 are gathered within an area indicated by imaginary lines and designated by SL in FIG. 7, where soldering occurs between the three terminals 306a and the associated conductive traces 316, 318 and 320, respectively. Thus, the soldering area SL is defined as the area where the tip ends of the terminals 360a extend when the circuit element 360 is positioned and overlaid on its desired footprint FP3. The lower side edge (as viewed in FIGS. 7 and 8) of the soldering area SL is indicated by the inner corners of the bent-shaped second ends of the conductive traces 316 and 320.

In accordance with one aspect of the present invention, one of the conductive traces, 304, is formed as a marker trace for indicating three of the four side edges of the outer boundary of the rectangular, desired footprint FP3 of the circuit element 360 as defined on the printed circuit board 300. More specifically, the marker trace 304 comprises a rectangular gate-shaped portion 304a and four stubs 304b, 304c, 304d and 304e extending in the horizontal directions (as viewed in FIGS. 7 and 8) from that portion 304a. The rectangular gate-shaped portion 304a comprises one horizontal and two vertical linear trace portions. Respective inner edges RI31, RI32 and RI33 (FIG. 7) of the linear trace portions will serve as the reference for positioning purposes (and thus are referred to as the "reference inner edges" hereinafter) and define three of the four side edges of the desired footprint FP3 of the circuit element 360 (i.e., the upper, right and left side edges as viewed in FIGS. 7 and 8). Note that the marker trace 304 can serve not only as a marker but also as a conductor for electrical signal transmission.

In mounting the circuit element 360 on the printed circuit board 300, the circuit element 360 is so placed on the top surface of the board 300 as to be overlaid on its desired footprint FP3 with high registration. This registration can be achieved with ease by aligning the upper, right and left side edges of the circuit element 360 (as viewed in FIG. 8) to the reference inner edges RI31, RI32 and RI33 of the marker trace 304, respectively. When the circuit element 360 is so positioned, the terminals 360a of the circuit element 360 are positioned on the conductive traces 316, 318 and 320, respectively. Then, the terminals 360a are soldered to the corresponding conductive traces to complete mounting of the circuit element 360 on the printed circuit board 300.

As understood from the above, with the printed circuit board 300 according to the third embodiment of the present invention, the marker (i.e., the marker trace 304) for indicating a part of the outer boundary of the desired footprint FP3 of the circuit element 360 may be formed through the same process as the other conductive traces 306 to 320 on the printed circuit board 300.

Further, with the printed circuit board 300 according to the third embodiment, the marker trace 304 may or may not be used for electrical signal transmission. It is just important that the maker trace 304 is formed through the same process and of the same material as the other conductive traces 206 to 216 used for electrical connection with other circuit elements and components (not shown) and thus is formed simultaneously with these conductive traces 306 to 316. It is also important that the maker trace 304 indicates such portions of the outer boundary of the desired footprint FP3 of the circuit element 360 that correspond to three of the four side edges of this generally rectangular footprint FP3. Also note that the above described arrangement may be applied to a flexible printed circuit board as well.

As apparent from the above, the present invention advantageously provides a printed circuit board having a marker formed thereon, with which a member to be mounted on the printed circuit board may be conveniently positioned with respect to the printed circuit board, and in which the marker may be formed through the same process as the conductive traces on the printed circuit board, without any need for additional and/or dedicated marker-forming process.

Having described the present invention with reference to several preferred embodiments thereof, it is to be understood that the present invention is not limited to the disclosed embodiments, but may be embodied in various other forms without departing from the spirit and the scope of the present invention as defined by the appended claims.

What is claimed is:

1. A printed circuit board comprising:
    a substrate;
    a plurality of conductive traces formed on the surface of said substrate for electrical signal transmission; and
    a marker trace formed on the surface of said substrate for indicating at least a part of a desired footprint of a member to be mounted on the surface of said printed circuit board;
    said marker trace being formed of the same material as said conductive traces and having a reference edge defined such that registration of the member to said desired footprint is achieved by aligning an outer edge of the member with said reference edge of said marker trace.

2. A printed circuit board according to claim 1, wherein:
    said marker trace indicates the entire outer boundary of said desired footprint of said member.

3. A printed circuit board according to claim 1, wherein:
    said desired footprint of the member is of an elongate shape having opposite ends; and
    said marker trace indicates such portions of the outer boundary of said desired footprint of said member that correspond to said opposite ends of said elongate shape.

4. A printed circuit board according to claim 1, wherein:
    said desired footprint of said member is of a generally rectangular shape having four side edges; and
    said marker trace indicates such portions of the outer boundary of said desired footprint of said member that correspond to three of said four side edges of said generally rectangular shape.

5. A printed circuit board according to claim 1, wherein:
    said desired footprint of said member is of a generally rectangular shape having four side edges; and
    said marker trace indicates such portions of the outer boundary of said desired footprint of said member that correspond to said four side edges of said generally rectangular shape.

6. A printed circuit board according to claim 1, wherein: said member comprises a double-sided adhesive sheet.

7. A printed circuit board according to claim 1, wherein: said member comprises a liquid crystal display panel.

8. A printed circuit board according to claim 1, wherein:
    said member comprises an interconnection-wiring rubber block for electrically interconnecting a liquid crystal display panel and at least some of said conductive traces formed on the surface of said substrate.

9. A printed circuit board according to claim 1, wherein: said member comprises a circuit element.

10. A printed circuit board according to claim 1, wherein:
    said member comprises a terminal of a circuit element; and
    said marker trace also indicates a soldering area for said terminal, and wherein the terminal is aligned with the soldering area for the terminal when the outer edge of the member is aligned with the reference edge.

11. A printed circuit board according to claim 1, wherein:
    said marker trace comprises a conductive trace for electrical signal transmission.

12. The printed circuit board according to claim 1, wherein:
    a size of said marker trace is the same as a size of the member.

* * * * *